United States Patent
Azzopardi et al.

(10) Patent No.: US 8,748,291 B2
(45) Date of Patent: Jun. 10, 2014

(54) METHOD FOR STRIP TESTING OF MEMS DEVICES, TESTING STRIP OF MEMS DEVICES AND MEMS DEVICE THEREOF

(71) Applicants: STMicroelectronics S.r.l., Agrate Brianza (IT); STMicroelectronics Ltd (Malta), Kirkop (MT)

(72) Inventors: Mark Anthony Azzopardi, Gudja (MT); Conrad Cachia, Tarxien (MT); Stefano Pozzi, Milan (IT)

(73) Assignees: STMicroelectronics S.r.l., Agrate Brianza (IT); STMicroelectronics Ltd (Malta), Kirkop (MT)

( * ) Notice: Subject to any disclaimer, the term of this patent is extended or adjusted under 35 U.S.C. 154(b) by 0 days.

(21) Appl. No.: 13/629,157

(22) Filed: Sep. 27, 2012

(65) Prior Publication Data
US 2013/0082258 A1    Apr. 4, 2013

(30) Foreign Application Priority Data
Sep. 30, 2011    (IT) .............. TO2011A0875

(51) Int. Cl.
| H01L 21/30 | (2006.01) |
| H01L 21/46 | (2006.01) |
| H01L 21/00 | (2006.01) |
| H01L 21/44 | (2006.01) |
| H01L 21/48 | (2006.01) |
| H01L 21/50 | (2006.01) |

(52) U.S. Cl.
USPC .............. 438/458; 438/33; 438/68; 438/110; 438/113

(58) Field of Classification Search
USPC .............. 438/15, 107, 109, 110, 617, 33, 68, 438/113, 114, 462, 464, 450, 458; 257/48, 257/E21.499, E23.01
See application file for complete search history.

(56) References Cited

U.S. PATENT DOCUMENTS

| 7,008,825 B1 | 3/2006 | Bancod et al. |
| 2008/0277765 A1 * | 11/2008 | Lane et al. .................. 257/622 |
| 2010/0072582 A1 | 3/2010 | Chandra et al. |

OTHER PUBLICATIONS

Gilleo, "MEMS and MOEMS Packaging Challenges and Strategies" in *MEMS/MOEM Packaging: Concepts, Designs, Materials and Processes*, McGraw-Hill, U.S., pp. 90-93, Jan. 1, 2005; XP007920402, ISBN: 978-0-07-145556-5.

* cited by examiner

*Primary Examiner* — Matthew Reames
*Assistant Examiner* — Dilinh Nguyen
(74) *Attorney, Agent, or Firm* — Seed IP Law Group PLLC (57) ABSTRACT

A method for testing a strip of MEMS devices, the MEMS devices including at least a respective die of semiconductor material coupled to an internal surface of a common substrate and covered by a protection material; the method envisages: detecting electrical values generated by the MEMS devices in response to at least a testing stimulus; and, before the step of detecting, at least partially separating contiguous MEMS devices in the strip. The step of separating includes defining a separation trench between the contiguous MEMS devices, the separation trench extending through the whole thickness of the protection material and through a surface portion of the substrate, starting from the internal surface of the substrate.

13 Claims, 5 Drawing Sheets

METHOD FOR STRIP TESTING OF MEMS DEVICES, TESTING STRIP OF MEMS DEVICES AND MEMS DEVICE THEREOF

BACKGROUND

1. Technical Field

The present disclosure relates to a method for strip testing of MEMS (Micro Electro Mechanical System) devices, to a testing strip of MEMS devices, and to a MEMS device configured to be used with the method.

2. Description of the Related Art

MEMS devices are playing an increasingly important role in the electronic industry, especially in the consumer electronic field of portable electronics, thanks to the reduced size and power consumption.

As is known, a MEMS device includes one or more dice of semiconductor material (e.g., in the case of a MEMS sensor device, a first die integrating a mechanical sensing structure and a second die integrating a related electronic interface made as an ASIC—Application Specific Integrated Circuit), encapsulated in a package, which protects and covers the dice and provides suitable electrical connections to the outside, e.g., for soldering to an external printed circuit board.

Common packages are the so called BGA (Ball Grid Arrays) or LGA (Land Grid Array) packages, which offer reduced area occupation and high density of the electrical connections.

Figure 1:
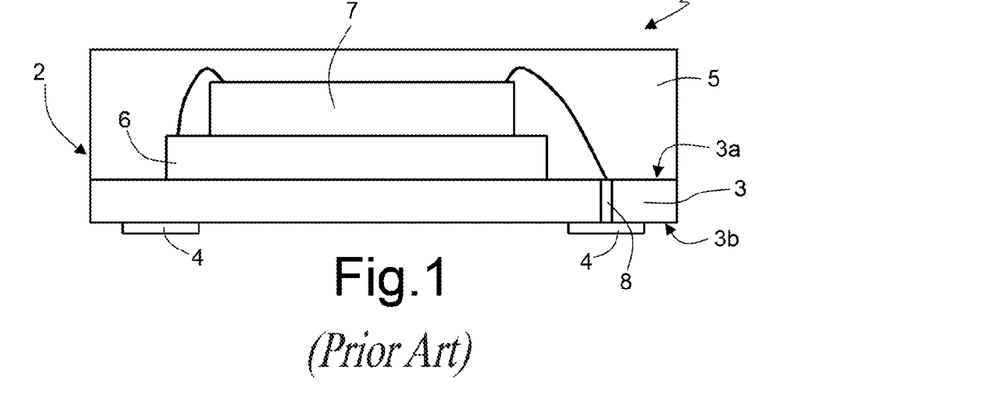
FIG. 1 shows a schematic cross section of a known MEMS device.

FIG. 1 schematically shows a MEMS device, denoted as a whole with reference 1, provided with a BGA or LGA package 2. Package 2 includes a substrate 3, having an internal surface 3a to which the dice of the MEMS device are attached, and an external surface 3b, which carries suitable electrical connection elements 4 to the outside of the package 2, in the form of an array of "balls" or "bumps" (in the case of BGA packages) or "lands" (in the case of LGA packages, as is the case shown in FIG. 1). The substrate 3 is usually made of a multi-layer structure, composed of several layers of conductive material (generally metal) separated via dielectric layers; electrical traces are provided through the substrate 3 to connect the dice to the external electrical connection elements 4. A covering and protection material, generally a mold compound 5, is provided on the substrate 3 and covers the dice, protecting them from the external environment.

In particular, in the example shown in FIG. 1, MEMS device 1 comprises a sensor die 6, including a micromechanical detection structure, and an ASIC die 7, including a related interface electronics. Dice 6 and 7 are stacked, with suitable electrical connections in the form of wires (using the so called "wire bonding" technique) designed to electrically connect sensor die 6 to ASIC die 7, and ASIC die 7 to the substrate 3; moreover, vias 8 and suitable traces are provided through the various layers of the substrate 3 to route the signals between the ASIC die 7 and the electrical connection elements 4 (these being either detection signals or power supply signals, or any other kind of signals exchanged between the MEMS device 1 and external devices). Clearly, other arrangements are possible for dice 6 and 7, which may be placed side-by-side on the substrate 3; or sensor die 6 may be attached to the ASIC die 7 with the flip-chip technique, with direct electrical connections being provided between the two dice.

In the semiconductor industry, testing of MEMS devices, in order to assess the electrical and mechanical performances of the finished products, accounts for an important part of the manufacturing costs, especially due to the amount of time and the expensive systems and apparatuses, which have to be provided for performing the testing operations. Testing generally envisages providing a stimulus (e.g., in the form of a physical stress) to a MEMS device and detecting an output electrical signal generated by the MEMS device in response thereto.

In order to reduce testing costs and increase the overall efficiency, so called "strip testing" procedures have been proposed, envisaging simultaneous parallel testing of a number of MEMS devices arranged in strips, according to matrix layouts, instead of separately testing single MEMS devices. These testing procedures allow to achieve a great productivity improvement and a reduction of the time used for testing, and thus a reduction of the final manufacturing costs.

Figure 2A:
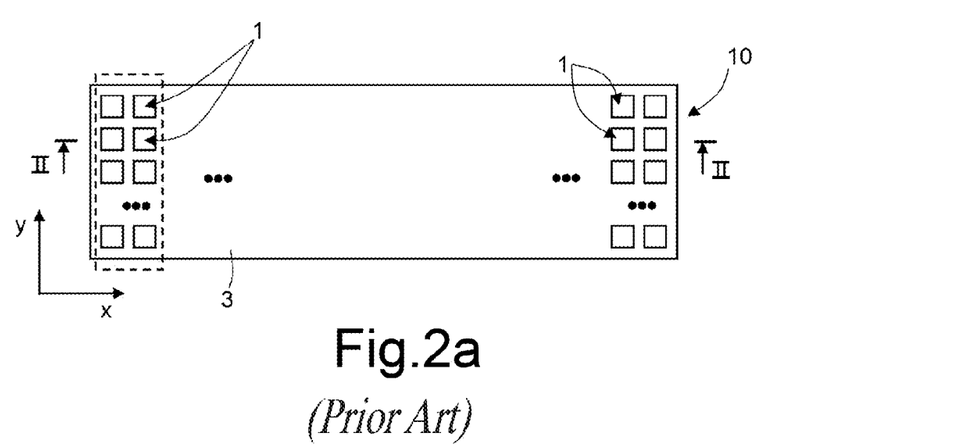
FIG. 2a shows schematically a top view of a strip of MEMS devices according to the prior art.
Figure 2B:
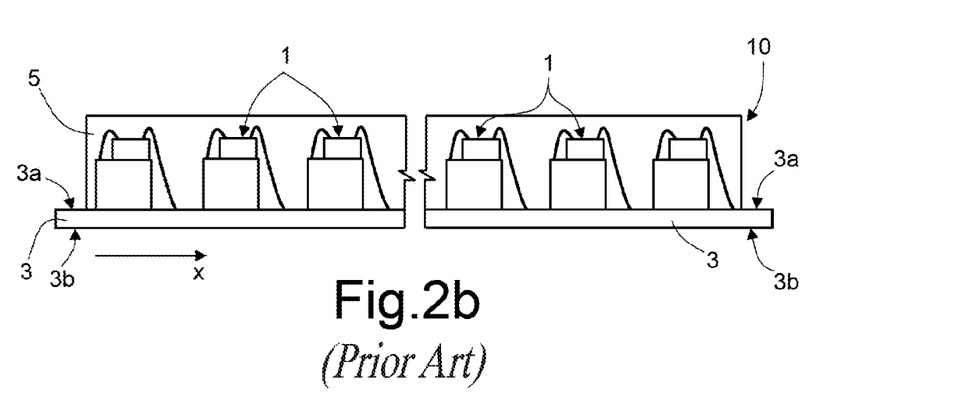

In this connection, FIGS. 2a and 2b schematically show a strip 10 of MEMS devices, again denoted with reference 1 (each one being for example a sensor device as shown in FIG. 1, or any other kind of known MEMS device). MEMS devices 1 are in a matrix arrangement, aligned along a first and second directions x, y of a plane xy: strip 10 in the example has a main extension along the first direction x. Testing systems may be designed for parallel testing of several devices, for example of a group thereof, as shown enclosed by the dashed box in FIG. 2a.

As depicted in FIG. 2b, the various MEMS devices 1 are enclosed in the same mold compound 5 and attached to the same substrate 3, after manufacturing (but before the final singulation step); therefore, it is considered that the substrate 3 includes a plurality of portions, each corresponding to a single MEMS device, each portion being separated by the others by a boundary region where the final cut during singulation will be performed.

However, especially in the case of MEMS sensors, parallel testing of devices arranged in strips implies some difficulties, due to the need to carry out suitable physical stimulation of the various sensors during testing (e.g., providing a test acceleration for acceleration sensors, or a test pressure for pressure sensors), and particularly due to the fact that the stresses acting on the devices in strip form are different from the stresses acting on the single devices, separated from the others. Moreover, the various devices in the strip are to be electrically insulated, in order to perform electrical tests on the individual devices.

Physical stimulation of the various devices during testing is achieved through the use of suitable testing equipments, configured to exert specific stresses on the devices, for example envisaging the use of support tables providing accelerations along a plurality of axes.

Various solutions have already been proposed in order to solve the problem related to the stresses acting on the devices while in strip form, and their electrical insulation.

In particular, a proposed solution envisages first the singulation of the various MEMS devices 1, and then their placing in a suitable carrier structure (or tray), provided with a plurality of housings, each adapted to house a respective singulated device. The housings in the carrier structure are arranged so as to define a strip of MEMS devices 1, which may undergo a parallel testing procedure.

This method is advantageous since no undesired stresses act on the singulated MEMS devices 1 during parallel testing operations. However, huge investments for preparing the support structures are needed to house the various MEMS devices 1, which have to be designed and manufactured for each possible package size; also, continuous maintenance of the carrier structures is conducted to assure correct alignment of the MEMS devices 1 during testing.

Figure 3:
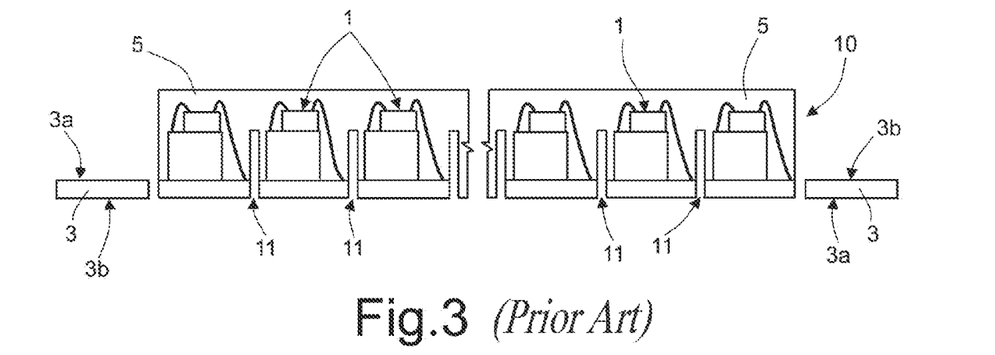
FIG. 3 shows a schematic cross section through a strip of MEMS devices, designed for a known "pre-cut" testing method.

A further testing procedure has been already employed by the present Applicant, the so called "pre-cut" method, envisaging, as shown schematically in FIG. 3, sawing of the common substrate 3 from the external surface 3b and of part of the overlying mold compound 5, so as to create trenches (or openings, or cut-out portions) 11 extending through the whole substrate 3 and through part of the mold compound 5. In a way that is not shown in FIG. 3, these trenches 11 extend in the strip 10 both along the first and the second directions x and y, so as to define a continuous hollow portion, separating and surrounding MEMS devices 1.

This cutting process also electrically insulates the various MEMS devices 1 from each other and allows testing in strip-form of the same devices, which are still hold together via the residual portions of the mold compound 5; in particular, thickness of this residual portion (starting from the surface thereof not originally contacting the internal surface 3a of the substrate 3) is configured to have sufficient rigidity to achieve the result of holding together the MEMS devices 1 during handling and testing operations. Moreover, the resulting physical separation achieved between MEMS devices 1 in the strip 10 limits the amount of reciprocal stresses during testing.

The Applicant has realized that, although advantageous, this testing procedure suffers from some drawbacks.

In particular, in the "pre-cut" process the final full separation of the various MEMS devices 1 (the so called "singulation" operation) is carried out after their testing in strip form. The singulation process releases the stresses exerted by the residual portion of the mold compound 5 on the devices, thus offsetting the devices from the previously calibrated values; indeed, the pre-cut process leaves a certain amount of residual stress acting on the devices during the calibration step, and after singulation the offset distribution is widely spread, possibly driving a part of the population out of a specification.

This offset thus implies the need of providing a second testing procedure, after the singulation operation, designed to guarantee that all finished MEMS devices 1 are within the specified tolerance values.

The Applicant has realized that this second testing step represents a non-value adding process, since it is performed only because of the remaining stresses acting on the MEMS devices 1 during the strip testing/calibration procedures.

Especially when MEMS production volume is increased, the investments in strip testing equipments and second test equipments have also to increase correspondingly and may come to represent an important part of the overall manufacturing costs. Therefore, the need is clearly felt for a testing procedure that would allow testing of MEMS devices in strip form, while reducing or possibly avoiding the need of performing a further testing step after singulation, thus drastically improving the overall testing costs and times.

BRIEF SUMMARY

One embodiment of the present disclosure is a strip testing method for MEMS devices, having improved overall performances and costs, allowing to solve, at least in part, the problems discussed above in connection with known testing methods.

One embodiment of the present disclosure is a method that includes testing a strip of MEMS devices, each MEMS device including a common substrate having an internal surface and an external surface, a die of semiconductor material coupled to the internal surface of the common substrate, and a protection material configured to cover the die. The method also includes detecting output values generated by each of the MEMS devices in response to a testing stimulus and before the detecting, partially separating contiguous MEMS devices in the strip. The separating includes forming a separation trench between the contiguous MEMS devices, the separation trench extending through an entire thickness of the protection material and through a surface portion of the substrate, starting from the internal surface of the substrate.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 2b shows a schematic cross section through the strip of FIG. 2a;

DETAILED DESCRIPTION

The present Applicant has realized that the common mold compound surrounding the various MEMS devices in the testing strip is a cause of the residual stresses acting on the same devices and offsetting the testing procedures.

Figure 4:
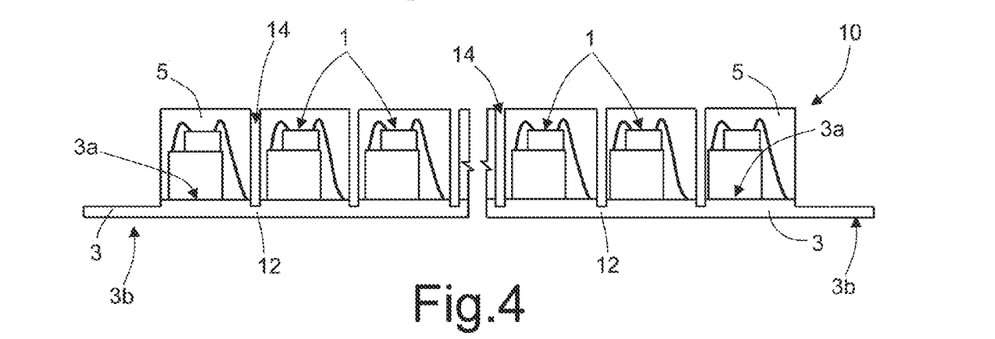
FIG. 4 shows a schematic cross section through a strip of MEMS devices, according to an embodiment of the present disclosure.

Accordingly, as shown in FIG. 4 (where same numerals denote same elements as disclosed above, which are not described again hereinafter), a first aspect of the present disclosure envisages, before carrying out of the testing operations, removing of the whole thickness of the mold compound 5 surrounding the MEMS devices 1 of the strip 10, e.g., via a cutting or sawing operation. The cut performed also extends through an internal surface portion (starting from the internal surface 3a on which the dice of the MEMS devices 1 are arranged) of the substrate 3, which is removed, leaving only residual substrate portions, denoted with 12, between contiguous MEMS devices 1. These residual substrate portions 12 (constituted by external surface portions of the substrate 3, starting from the external surface 3b, opposite to the internal surface 3a) hold together the various MEMS devices 1 during testing in strip form. In particular, the removal operation thus defines separation trenches, here denoted with 14, separating the various MEMS devices 1 (and arranged between contiguous MEMS devices 1, and surrounding each one of them), extending through the whole thickness of the mold compound 5 and through the internal surface portion of the substrate 3. In a manner that is not shown, these separation trenches 14 extend in the strip 10 both along the first and the second directions x and y, so as to define a continuous hollow (or cut-out) portion.

According to an embodiment, the separation trenches 14 may extend through the substrate 3 from the internal surface 3a up to half the thickness of the same substrate 3.

The presence of separation trenches 14 not only allows to reduce the stresses acting on the various MEMS devices 1 (the Applicant has indeed realized that the residual substrate portions 12 originate a much lesser mechanical stress on the MEMS devices 1, and less stress is thus released during subsequent full singulation of the devices), but also allow to electrically insulate the various MEMS devices 1 in the strip 10, by removing any possible electrical connections between the devices in the substrate. Indeed, these electrical connections may be conveniently arranged in the internal surface portion of the substrate 3, at the boundary of the various MEMS devices, which is removed in the material removal process defining the separation trenches 14. The residual portions 12 of the substrate 3 instead do not carry any electrical connection between contiguous MEMS devices 1, so that the same MEMS devices 1 are electrically insulated and ready to be tested.

Given that generally the substrate 3 is made of a plurality of layers (conductive and dielectric stacked layers), the discussed removal operation is designed to affect only some of the layers, in particular the first layers, i.e., the layers more proximate to the internal surface 3a, to which the dice of the MEMS devices 1 are attached.

In particular, it is known that the multilayer structure of a substrate includes a central layer, and symmetrical stacked conductive and dielectric layers overlying and underlying the central layer; each conductive layer (made of a metal material, e.g., copper) is defined, e.g., via an etching process, to create the pattern of electrical connections through the substrate, and is separated from the other conductive layers by means of contiguous dielectric layers (e.g., made of BT or FR-4).

Figure 5:
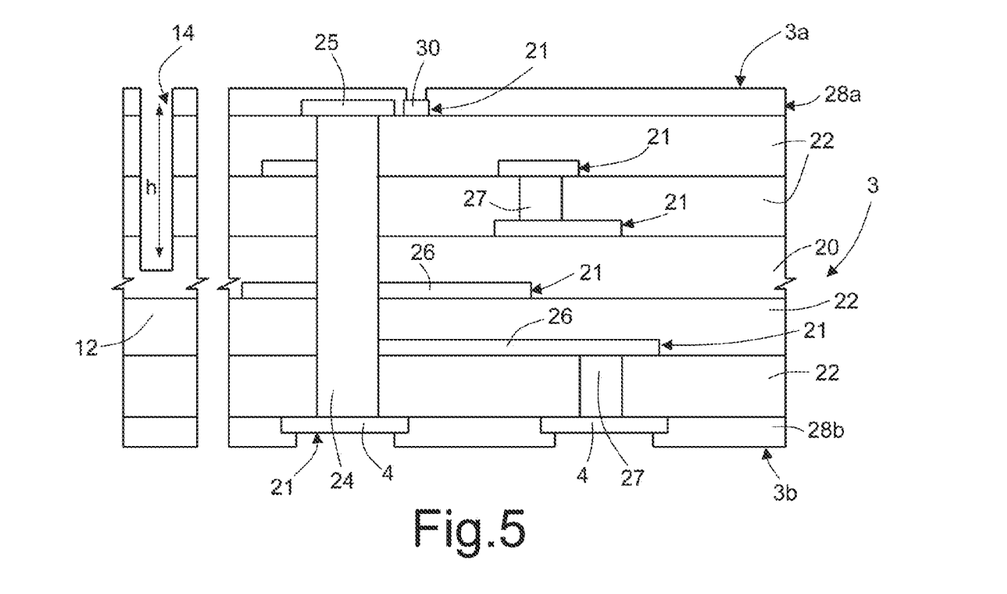
FIG. 5 shows a more detailed cross section through a portion of a substrate of the strip of FIG. 4.

An exemplary multilayer structure for a substrate, again denoted with 3, is shown in FIG. 5, where: the central layer, made of a dielectric material (e.g., BT or FR-4) is denoted with 20; the suitably defined conductive layers are denoted with 21; and the other dielectric layers are denoted with 22 (as it is shown, each dielectric layer 22 is arranged between two conductive layers 21, so as to separate them). A first conductive layer 21 is considered to be arranged at the internal surface 3a of the substrate 3, while a last conductive layer 21 is considered to be arranged at the external surface 3b of the same substrate 3.

Conductive through vias, here denoted with 24, are conveniently provided through the substrate 3, so as to define electrical connections between internal conductive pads 25 on the internal surface 3a and external connection elements 4 on the external surface 3b. Conductive traces 26 are conveniently provided in the various conductive layers 21 to route the signals through the substrate 3; likewise, internal vias 27 are provided to connect the various conductive layers 21, within the substrate 3.

Moreover, a first protective layer 28a (so called "solder mask") is provided on the first conductive layer 21, above the internal surface 3a of the substrate 3, to cover and protect the traces and pads provided therein, except at access openings to the same first conductive layer 21, e.g., at bonding pads 30 (so called bonding fingers, arranged at the internal surface 3a for bonding to the ASIC dice 7 of the MEMS devices 1, here not shown, via the wire boding technique). Analogously, a second solder mask layer 28b is provided on the last conductive layer 21, above the external surface 3b of the substrate 3, except at access openings to the same last conductive layer 21, e.g., at the external electrical connections 4.

As previously discussed, separation trenches 14 made at the periphery of each MEMS device 1 (i.e., in the boundary portions of the substrate 3 between contiguous MEMS devices) may have a height h, in the direction transverse to the internal surface 3a of the substrate 3, such as to extend at least through the whole first conductive layer 21, and up to reach the central layer 20 (extending through part of the same central layer 20); for reasons of structural stability, separation trenches 14 are not designed to extend below the central layer 20.

Various design possibilities may thus be envisaged, according to which separation trenches 14 may have different extensions through the substrate 3, so that a different number of substrate layers are removed or preserved by the cutting operation (the double-arrow in FIG. 5 denotes an exemplary range of variability for the height h of the separation trenches 14 within the substrate 3).

Figure 6A:
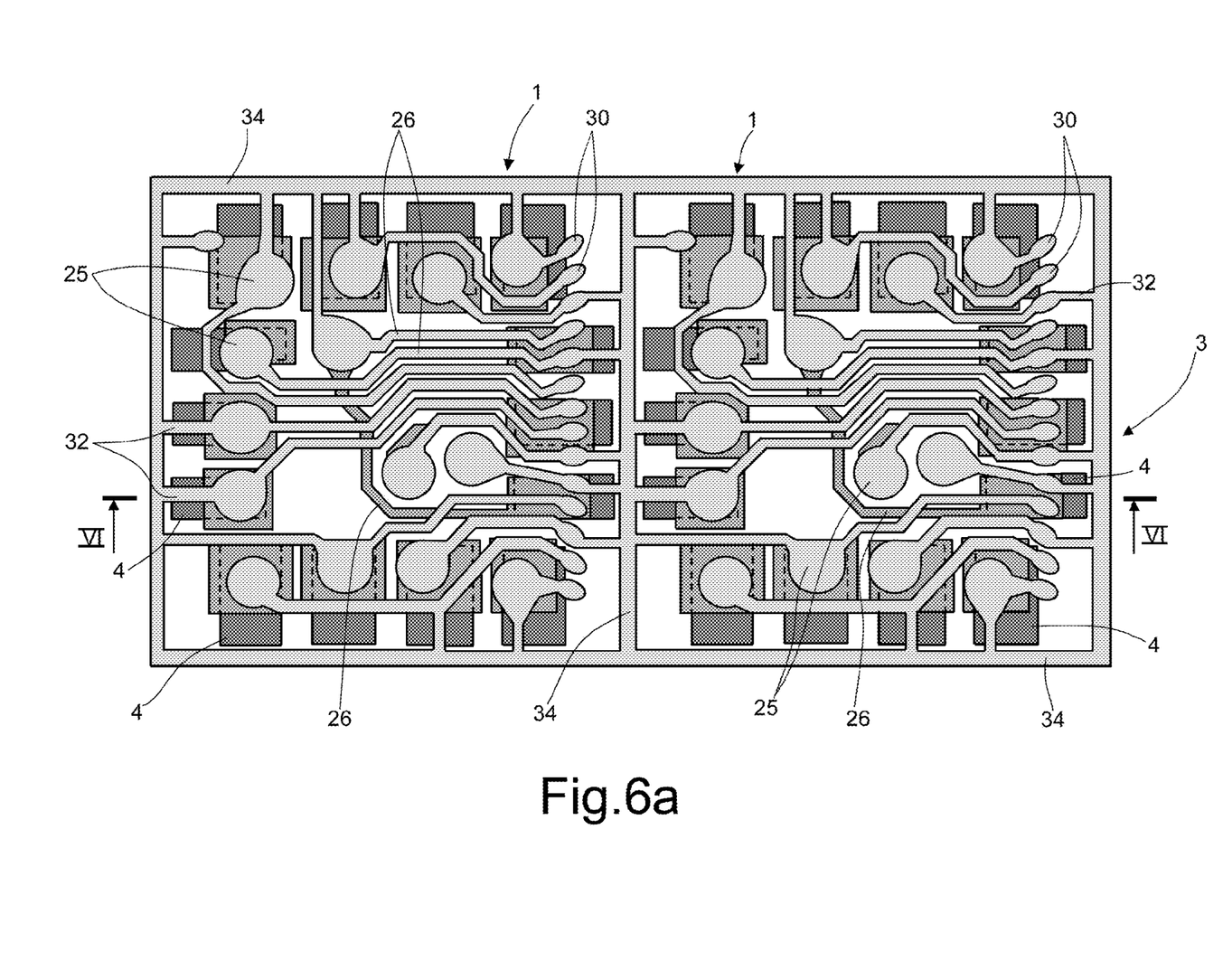
FIG. 6a shows a schematic top view of the substrate portions of two contiguous MEMS devices, according to an embodiment of the present disclosure.
Figure 6B:
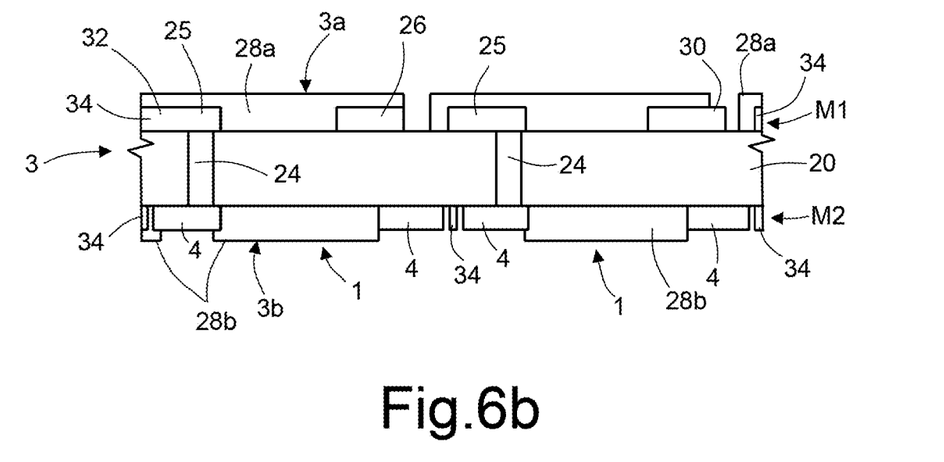
FIGS. 6b and 6c show cross sections of the substrate portions of FIG. 6a, before and, respectively, after a sawing process.
Figure 6C:
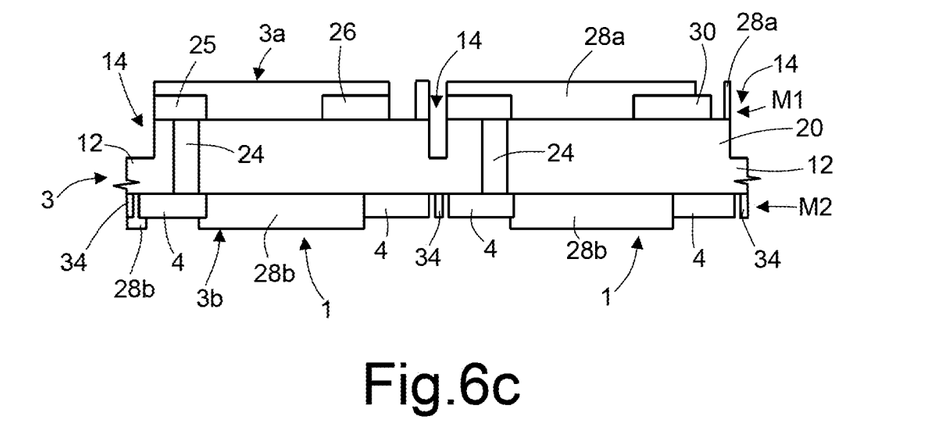

FIGS. 6a-6c show, by way of example, a portion of the substrate 3 regarding two contiguous MEMS devices 1, according to an embodiment of the present disclosure (it is clear, however, that a greater number of devices are provided in the same substrate 3 and belong to the testing strip 10).

Substrate 3 here includes: the central layer 20; a first conductive layer, here denoted with M1 (as it is usual in the field), contiguous to the internal surface 3a of the substrate 3; and a second conductive layer, here denoted with M2, contiguous to the external surface 3b of the same substrate 3. Conductive traces 26 are provided in the first conductive layer M1, e.g., to define electrical connections between bonding pads 30, and internal conductive pads 25 and conductive through vias 24. Conductive traces 26 are also provided in the second conductive layer M2, to define electrical connections between the through vias 24 and the external electrical connections at the external surface 3b of the substrate 3, here in the form of lands and again denoted with 4.

Moreover, in a known manner, plating traces 32 are defined in the first conductive layer M1, to provide electrical connections between the first conductive traces 26 (and/or the bonding pads 30 and/or the internal conductive pads 25 and/or the conductive through vias 24) and a plating bar 34.

Plating bar 34 is arranged at the periphery of each MEMS device 1 and defines a boundary between contiguous devices (in the embodiment of FIG. 6a, plating bar 34 defines a square ring around each MEMS device 1). In a known manner, plating bar 34 is defined in the first conductive layer M1 and may be defined also in the second conductive layer M2, and it is biased with a suitable electrical voltage during an electroplating process, so as to electrically plate the conductive traces 26, bonding pads 30, internal conductive pads 25 and/ or conductive through vias 24 with a thin layer of protective material via a chemical ionization process.

According to a particular aspect of the present embodiment, all plating traces 32 are formed in the first conductive layer M1, and no plating traces are formed in the second conductive layer M2, so that no electrical connection to the plating bar 34 is provided in the same second conductive layer M2.

Since plating bar 34 is common to all MEMS devices 1, its presence electrically short circuits traces and pads of different devices. However, the removal process defining the separation trenches 14 is designed to remove the first conductive layer M1 in the boundary regions between the various MEMS devices 1 (in correspondence to the plating bar 34), thus removing the same plating bar 34 and at least part of the plating traces 32 connected to the plating bar 34; in this manner, electrical insulation is provided between the MEMS devices 1 before testing in strip form.

The result of the selective removal of the portions of the first conductive layer M1 is schematically shown in FIG. 6c, where separation trenches 14 and residual portions 12 of the substrate 3 are shown between contiguous MEMS devices 1.

It is clear that similar considerations apply when the substrate 3 includes a higher number of layers, in which case plating traces 32 connecting to the plating bar 34 are to be designed only in the conductive layers 21 that will be removed in the removal operation before testing of the MEMS devices 1 in strip form. Therefore, if peripheral portions of first and second conductive layers 21 are removed in the cutting operation (e.g., in the case of a substrate having five layers), then all plating traces 32 will be routed in the same first and second conductive layers 21, so as to achieve electrical insulation between the various MEMS devices 1 before testing is carried out.

The present Applicant has verified, through tests and simulations, that the present solution allows to achieve improved performance during strip testing (with a reduced number of failures and of devices falling out of desired specifications); in particular, it is possible to avoid second testing procedures after singulation of the MEMS devices 1.

Figure 7:
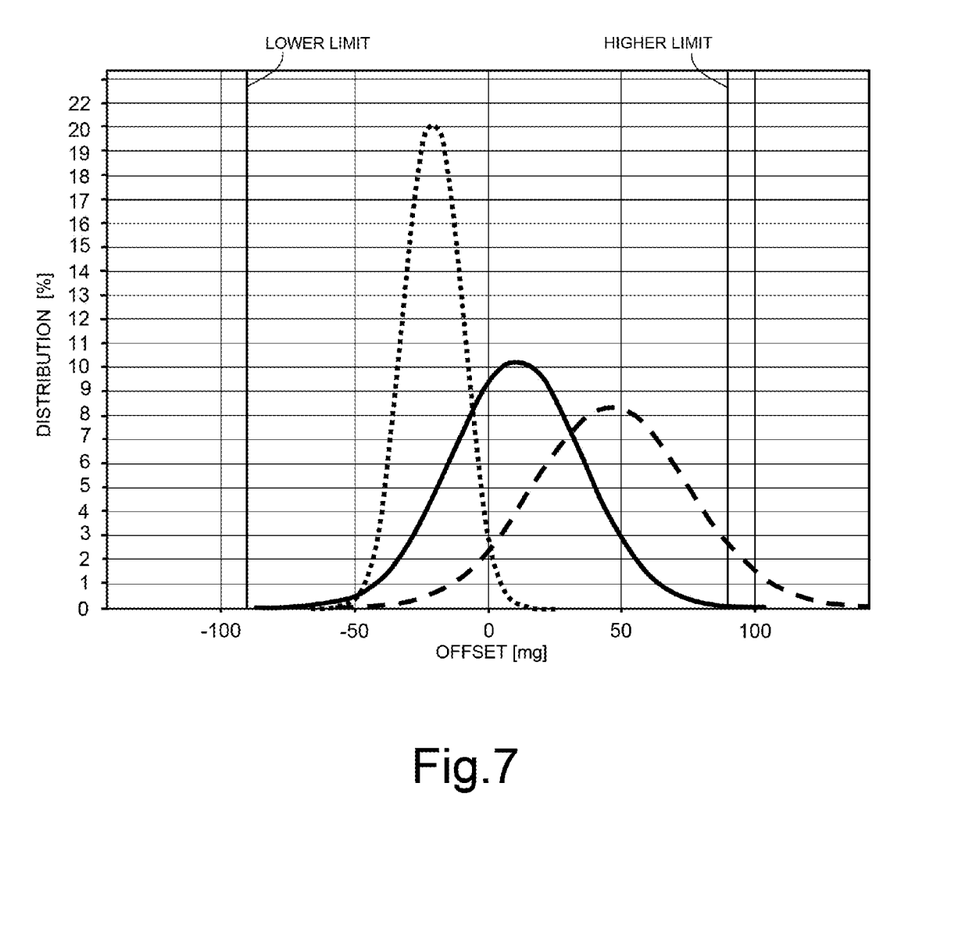
FIG. 7 shows plots related to testing performances of the MEMS devices of the strip.

FIG. 7 shows plots relating to the testing performance in terms of offset from desired specification values; the distribution of the MEMS devices 1 according to the present solution (shown in continuous line) is compared to a distribution of devices tested using the "pre-cut method" (shown in dashed lines) and to a distribution of singulated devices after a second test procedure (shown in dotted line). FIG. 7 also shows, as a box, the desired specification outer limits, so that it is evident that the present solution allows to satisfy the specification, even when a second testing procedure is not carried out, as opposed to previously known methods.

From what has been described and illustrated, the advantages that the present solution allows to achieve are evident.

In particular, it is again underlined that, during strip testing, the residual portions 12 of the substrate 3 exert less stress on the MEMS devices 1, thus providing a minimal offset between calibration and final performances of the devices; second testing procedures may even be avoided, drastically improving the costs for testing of the MEMS devices.

No carrier is used during testing, and the placement tolerances of the various devices in the strip 10 are related only to the substrate manufacturing tolerances (which are usually very low).

There may be modification of the usual substrate design, in terms of placement of the plating traces 32, which have to be concentrated in the layer(s) of the substrate 3 that are partially removed before testing, this does not entail an increase of the design and manufacturing complexity.

Finally, it is clear that modifications and variations may be made to what has been described and illustrated herein, without thereby departing from the scope of the present disclosure.

In particular, the structure of the substrate 3 may differ from the specific embodiments previously shown and discussed, e.g., in terms of the number of layers and constituent materials; also the depth and extension of the separation trenches 14 in the substrate (and the extent of removal of the surface portion of the same substrate) may change accordingly.

Moreover, the discussed testing solution may be applied when testing any kind of MEMS devices in strip form, even if it is particularly advantageous in case of MEMS sensors, which may be greatly affected by residual stresses during testing operations.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
testing a strip of MEMS devices formed on a common substrate having an internal surface and an external surface, each MEMS device including a die of semiconductor material coupled to the internal surface of the common substrate, and a protection material configured to cover the die, the testing including:
detecting output values generated by each of the MEMS devices in response to a testing stimulus; and
before the detecting, partially separating contiguous MEMS devices in the strip, the separating including:
forming a separation trench between the contiguous MEMS devices, the separation trench extending through an entire thickness of the protection material and through a surface portion of the substrate, starting from the internal surface of the substrate; and
electrically insulating the contiguous MEMS devices by removing the surface portion of the substrate; and
forming electrical connections between the contiguous MEMS devices in the surface portion of the substrate, forming the electrical connections includes forming plating traces and a common plating bar, the plating traces being coupled to the common plating bar, the plating bar forming a boundary between the contiguous MEMS devices; and
the separating including removing the plating bar and a part of the plating traces coupled to the plating bar.

2. The method according to claim 1, wherein forming the separation trench includes forming the separation trench with a height in the substrate that is not more than half of a thickness of the substrate.

3. The method according to claim 1, wherein the separating includes leaving a residual portion that is adjacent to the external surface of the substrate between the contiguous MEMS devices; and during the detecting, the residual portion being configured to hold the MEMS devices together.

4. The method according to claim 1, wherein the separating includes physically and electrically separating the contiguous MEMS devices.

5. The method according to claim 1, wherein forming the electrical connections includes forming the electrical connections only within the surface portion of the substrate.

6. The method according to claim 1, further comprising:
forming the substrate with a multi-layered structure, the forming of the substrate including:
forming a plurality of stacked conductive layers that includes:
forming a first outer conductive layer in the surface portion of the substrate;
forming a central conductive layer; and
forming a second outer conductive layer in the surface portion of the substrate, the central conductive layer separating the first and second outer conductive layers;

forming a plurality of dielectric layers that separate the conductive layers; and forming the plating traces and plating bar in the first and second outer conductive layers.

7. The method according to claim 1, further comprising: coupling an ASIC die having interface electronics to a sensor in each MEMS device; and coupling a detection structure of each MEMS device to the interface electronics of the ASIC die.

8. A method, comprising:

forming a strip of micro-electromechanical devices on a substrate, each micro-electromechanical device including a die of semiconductor material coupled to an internal surface of the substrate, and a protection material covering the die;

forming separation trenches extending through an entire thickness of the protection material and through a surface portion of the substrate, starting from the internal surface of the substrate, each separation trench being between adjacent ones of the micro-electromechanical devices;

providing a testing stimulus to each of the micro-electromechanical devices;

detecting respective output values from the micro-electromechanical devices in response to the testing stimulus; and testing the strip by analyzing the output values;

forming electrical connections between the micro-electromechanical devices in the surface portion of the substrate, forming the electrical connections includes forming plating traces and a common plating bar, the plating traces being coupled to the common plating bar, the plating bar forming a boundary between the micro-electromechanical devices; and electrically insulating the micro-electromechanical devices by removing the surface portion of the substrate; and forming the separation trenches includes removing the plating bar and a part of the plating traces coupled to the plating bar.

9. The method of claim 8, wherein forming the separation trench includes forming the separation trench with a height in the substrate that is not more than half of a thickness of the substrate to partially separate the substrate.

10. The method of claim 8, wherein forming the separation trench leaving a residual portion of the substrate that is adjacent to an external surface of the substrate between the micro-electromechanical devices and during the detecting, the residual portion being configured to hold the micro-electromechanical devices together.

11. The method of claim 8, wherein forming the separation trench includes physically and electrically separating the micro-electromechanical devices.

12. The method of claim 8, wherein forming the electrical connections includes forming the electrical connections only within the surface portion of the substrate.

13. The method of claim 8, further comprising:

forming the substrate with a multi-layered structure, forming the substrate including:

forming a plurality of stacked conductive layers that includes:

forming a first outer conductive layer in the surface portion of the substrate;

forming a central conductive layer; and forming a second outer conductive layer in the surface portion of the substrate, the central conductive layer separating the first and second outer conductive layers;

forming a plurality of dielectric layers that separate the conductive layers; and forming the plating traces and plating bar in the first and second outer conductive layers.

* * * * *